(12) United States Patent
Xu et al.

(10) Patent No.: US 11,881,679 B2
(45) Date of Patent: Jan. 23, 2024

(54) GALLIUM NITRIDE SUBSTRATE AND SEMICONDUCTOR COMPOSITE SUBSTRATE

(71) Applicant: SUZHOU NANOWIN SCIENCE AND TECHNOLOGY CO., LTD., Suzhou (CN)

(72) Inventors: Yu Xu, Suzhou (CN); Jianfeng Wang, Suzhou (CN); Ke Xu, Suzhou (CN)

(73) Assignee: SUZHOU NANOWIN SCIENCE AND TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 18/030,641

(22) PCT Filed: Aug. 13, 2021

(86) PCT No.: PCT/CN2021/112383
§ 371 (c)(1),
(2) Date: Apr. 6, 2023

(87) PCT Pub. No.: WO2022/151728
PCT Pub. Date: Jul. 21, 2022

(65) Prior Publication Data
US 2023/0327393 A1    Oct. 12, 2023

(30) Foreign Application Priority Data
Jan. 18, 2021   (CN) .......................... 202110061226.2

(51) Int. Cl.
*H01S 5/02*      (2006.01)
(52) U.S. Cl.
CPC ................... *H01S 5/0207* (2013.01)
(58) Field of Classification Search
CPC ............ H01S 5/0206; H01S 5/0207; H01S 5/0211–0212; H01S 2304/04;
(Continued)

(56) References Cited

U.S. PATENT DOCUMENTS 7,754,504 B2 * 7/2010 Ohmae ................... H01L 33/12
                                                                       257/88
2004/0262624 A1 * 12/2004 Akita ...................... C30B 29/406
                                                                      257/90
(Continued)

FOREIGN PATENT DOCUMENTS

| CN | 1894446 A | 1/2007 |
|---|---|---|
| CN | 101447542 A | 6/2009 |

(Continued)

OTHER PUBLICATIONS

International Search Report of Application No. PCT/CN2021/112383 dated Nov. 1, 2021.
(Continued)

*Primary Examiner* — Joshua King
(74) *Attorney, Agent, or Firm* — Ladas & Parry LLP

(57) ABSTRACT

The present disclosure provides a gallium nitride substrate, where the gallium nitride substrate has a surface having a diameter not less than 50 mm; nine circular regions having a diameter not greater than 1 mm are taken on a surface of the gallium nitride substrate; threading dislocation densities and threading dislocation tilt angles are calculated at the nine circular regions using a multi-photon excitation photoluminescence spectrum; an average value of products of the threading dislocation densities in the nine circular regions and tangent values of the threading dislocation tilt angles is not greater than 1E6 cm−2; and a quotient of a difference between a maximum value and a minimum value of the products of the threading dislocation densities in the nine circular regions and the tangent values of the threading dislocation tilt angles divided by the average value is not greater than 50%.

5 Claims, 4 Drawing Sheets

(58) Field of Classification Search
CPC ............. H01L 29/2003; H01L 21/0254; H01L 21/02458; H01L 21/02389; C30B 29/406
See application file for complete search history.

(56) References Cited

U.S. PATENT DOCUMENTS

| | | | | |
|---|---|---|---|---|
| 2010/0200866 | A1* | 8/2010 | Kitou | C30B 29/36 |
| | | | | 257/77 |
| 2015/0233821 | A1* | 8/2015 | Seo | C30B 25/00 |
| | | | | 118/712 |
| 2015/0333122 | A1* | 11/2015 | Chan | H01L 29/20 |
| | | | | 257/329 |
| 2017/0137966 | A1* | 5/2017 | Kiyama | C30B 29/64 |
| 2020/0098649 | A1* | 3/2020 | Fujii | H01L 21/02389 |

FOREIGN PATENT DOCUMENTS

| | | | | | |
|---|---|---|---|---|---|
| CN | 103320864 | A | * | 9/2013 | ......... C01B 21/0632 |
| CN | 106536794 | A | | 3/2017 | |
| CN | 112397571 | A | | 2/2021 | |
| JP | 4145437 | B2 | * | 9/2008 | ............. C30B 25/02 |
| JP | 4432180 | B2 | * | 3/2010 | ............. B82Y 20/00 |
| JP | 2010278199 | A | * | 12/2010 | ....... H01L 29/66462 |
| JP | 2019214496 | A | * | 12/2019 | ......... C01B 21/0632 |
| WO | WO-0184608 | A1 | * | 11/2001 | .......... H01L 21/0237 |

OTHER PUBLICATIONS

Written Opinion of Application No. PCT/CN2021/112383 dated Nov. 1, 2021.

* cited by examiner

| Magnesium-doped gallium nitride (GaN:Mg) |
| Magnesium-doped aluminum gallium nitride ($Al_xGa_{(1-x)}N$:Mg) |
| Undoped indium gallium nitride ($In_yGa_{(1-y)}N$, undoped) |
| Undoped gallium nitride (undoped GaN) |
| Undoped indium gallium nitride ($In_xGa_{(1-x)}N$) |
| Undoped gallium nitride (undoped GaN) |
| Undoped indium gallium nitride ($In_xGa_{(1-x)}N$) |
| Undoped gallium nitride (undoped GaN) |
| Undoped indium gallium nitride ($In_xGa_{(1-x)}N$, undoped) |
| Silicon-doped aluminum gallium nitride $Al_xGa_{(1-x)}N$:Si |
| Free-standing gallium nitride substrate (GaN) |

FIG. 6

GALLIUM NITRIDE SUBSTRATE AND SEMICONDUCTOR COMPOSITE SUBSTRATE

CROSS REFERENCE TO RELATED APPLICATIONS

This application is a U.S. National Stage Application under 35 U.S.C. § 371 of International Application No. PCT/CN2021/112383 which was filed on 13 Aug. 2021, which claims priority from Chinese Application No. 202110061226.2 filed 18 Jan. 2021 the disclosures of which are incorporated in their entirety by reference herein.

TECHNICAL FIELD

The present disclosure relates to the technical field of semiconductors, and in particular, to a low-stress gallium nitride substrate.

BACKGROUND

As the core key material of the third-generation semiconductor industry, GaN has excellent properties, such as extremely high optical-electrical conversion efficiency, low power consumption. It is the core foundation of the future new generation of optoelectronics, power electronics, and high-frequency microelectronics devices.

The current main method for fabricating a free-standing GaN substrate is hydride vapor phase epitaxy (HYPE). All reactions of this method are performed in a quartz tube of HYPE equipment, which is divided into two different temperature regions.

First, metal Ga is placed at the 850° C. region of the quartz tube, and the substrate is placed at the 1050° C. region. Then ammonia gas ($NH_3$) and hydrogen chloride gas (HCl) as reactants are introduced into the 850° C. region first from the left end of the quartz tube. The following chemical reaction takes place in this region:

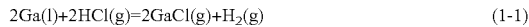

$$2Ga(l)+2HCl(g)=2GaCl(g)+H_2(g) \qquad (1\text{-}1)$$

The reactant GaCl gas obtained above is guided into the 1050° C. high-temperature region by mixing an appropriate amount of $H_2$ and $N_2$ as carrier gas, and reacts with $NH_3$:

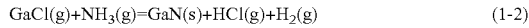

$$GaCl(g)+NH_3(g)=GaN(s)+HCl(g)+H_2(g) \qquad (1\text{-}2)$$

By means of the two reactions, a GaN material is generated, which constitutes the growth mechanism of epitaxy of GaN by means of HYPE, and generated exhaust gas is discharged into an exhaust tube from one end of the quartz tube. An appropriate hetero-substrate (such as sapphire) is placed in the high-temperature region, and GaN can be epitaxially grown on the substrate. When grown to a certain thickness, GaN is taken out, and then the substrate is subjected to separation, shape processing, grinding, and polishing to obtain the free-standing substrate.

However, due to the difference in lattice constant and thermal expansion coefficient (lattice and thermal mismatch) between the hetero-substrate and GaN during heteroepitaxial growth, a variety of crystal defects are generated in the GaN substrate. These defects lead to easy occurrence of fragments and cracking during subsequent GaN processing or epitaxy of device structures on the GaN substrate used as a base. Thus, an adverse impact is brought.

To solve the above problem, in CN106536794, for the gallium nitride substrate, the characterization of the wave number difference at the peak of its micro-Raman scattering is defined, and it is considered that when the gallium nitride substrate satisfies the limited parameters in this patent, the stress of the gallium nitride substrate can be reduced, thereby effectively reducing the cracking and fragments in the subsequent epitaxy process.

However, the periodic fluctuation of stress occurs only when the GaN substrate is fabricated using patterned periodic epitaxial growth, and it is required to control the wave number difference at the peak of the micro-Raman scattering to fluctuate within a certain range. For the GaN substrate fabricated by means of non-periodic structure epitaxial growth, its stress is controlled within a certain particular relatively small range. The latest research shows that a large amount of defects in the epitaxial GaN substrate mainly exist in the form of edge dislocations, screw dislocations, and mixed dislocations, where the components (or referred to as lateral dislocations) of the edge dislocations or the mixed dislocations in the horizontal direction are related to GaN internal stress (refer to non-patent document 1 for details). Therefore, by controlling the dislocation density and the components of the dislocations in the horizontal direction, the GaN internal stress can be effectively controlled. However, simply using micro-Raman scattering parameters to characterize the gallium nitride substrate cannot fully represent the defect forms in the gallium nitride substrate. Moreover, due to its limited resolution (generally 0.1 $cm^{-1}$), its relatively small internal stress cannot be characterized well. Especially in some usage occasions where great stress is generated in the epitaxy process of a device, such as the epitaxy of a GaN-based blue or green laser, the requirements for the GaN substrate are higher. A better detection method is sought to control the internal stress of the GaN substrate to meet higher epitaxy requirements.

CITED NON-PATENT DOCUMENTS

[1] Foronda, H. M.; Romanov, A. E.; Young, E. C.; Roberston, C. A.; Beltz, G. E.; Speck, J. S. Curvature and bow of bulk GaN substrates. Journal of Applied Physics 2016, 120 (3) 035104.

[2] Tanikawa, T.; Ohnishi, K.; Kanoh, M.; Mukai, T.; Matsuoka, T. Three-dimensional imaging of threading dislocations in GaN crystals using two-photon excitation photoluminescence. Applied Physics Express 2018, 11 (3) 031004.

SUMMARY

In this regard, the purpose of the present disclosure is to provide a gallium nitride (GaN) substrate. By defining that during fabrication, it is required to control lateral dislocations (that is, control two aspects: 1. edge dislocation or mixed dislocation density, and 2. edge dislocation or mixed dislocation tilt angle), stress is reduced, thereby reducing cracking and fragments during processing of the GaN substrate or during epitaxial fabrication of the related device thereon.

To achieve the above purpose of the disclosure, the present disclosure provides a gallium nitride substrate, where the gallium nitride substrate has a surface having a diameter not less than 50 mm; nine circular regions having a diameter not greater than 1 mm are taken on a surface of the gallium nitride substrate; positions of the nine circular regions are respectively distributed at a center position and eight surrounding positions of the surface of the gallium nitride substrate; threading dislocation densities and threading dislocation tilt angles are calculated at the nine circular regions using a multi-photon excitation photoluminescence spectrum; an average value of products of the threading dislocation densities in the nine circular regions and tangent values of the threading dislocation tilt angles is not greater than 1E6 $cm^{-2}$; and a quotient of a difference between a maximum value and a minimum value of the products of the threading dislocation densities in the nine circular regions and the tangent values of the threading dislocation tilt angles divided by the average value is not greater than 50%.

Preferably, the gallium nitride substrate has a surface having a diameter not less than 100 mm, and the average value of the products of the threading dislocation densities in the nine circular regions and the tangent values of the threading dislocation tilt angles is not greater than 5E5 $cm^{-2}$.

Preferably, the gallium nitride substrate has a surface having a diameter not less than 100 mm, and the quotient of the difference between the maximum value and the minimum value of the products of the threading dislocation densities in the nine circular regions and the tangent values of the threading dislocation tilt angles divided by the average value is not greater than 40%.

Preferably, the eight surrounding positions are located on a same circumference and are distributed along the circumference at an equal interval.

According to the purpose of the present disclosure, further provided is a semiconductor composite substrate using the above gallium nitride substrate as a supporting substrate.

Compared with the related art, the present disclosure has the beneficial effects of reducing the stress of the gallium nitride substrate, so that it has the effect of suppressing cracking and fragments when supporting other epitaxial layers, thereby improving the yield of the semiconductor composite substrate and reducing costs.

BRIEF DESCRIPTION OF THE DRAWINGS

To describe the technical solutions in the embodiments of the present disclosure or the related art more clearly, the following briefly describes the drawings required for describing the embodiments or the related art. Apparently, the drawings in the following description show merely some embodiments of the present disclosure, and a person of ordinary skill in the art may still derive other drawings from these drawings without creative efforts.

FIG. 6 is a schematic structural diagram of an epitaxial laser.

DETAILED DESCRIPTION

The following describes the present disclosure in detail in conjunction with implementations. However, these implementations do not limit the present disclosure. Functions, methods, or equivalent transformations or substitutions in structure made by a person of ordinary skill in the art according to these implementations all fall within the scope of protection of the present disclosure.

To facilitate the innovative solution of the present disclosure, the principle of the threading dislocation density characterization method in the present disclosure is first introduced.

Usually, threading dislocations refer to edge dislocations, screw dislocations, or mixed dislocations in the C-axis direction existing in a GaN substrate, and the dislocations are dislocations that pass through the interior of the GaN crystal and reach a GaN surface.

The threading dislocation density is the number of dislocations penetrating to the GaN surface within a certain surface area, the unit is centimeter$^{-2}$ (abbreviated as $cm^{-2}$), and the threading dislocation density can be estimated by means of the following methods:

The GaN substrate is immersed in an acid ($H_3PO_4$) or alkaline (molten KOH) solution for corrosion, the positions where dislocations occur are easily corroded to form pits, and the density of the pits formed by corrosion on the GaN surface is the threading dislocation density.

Figure 1:
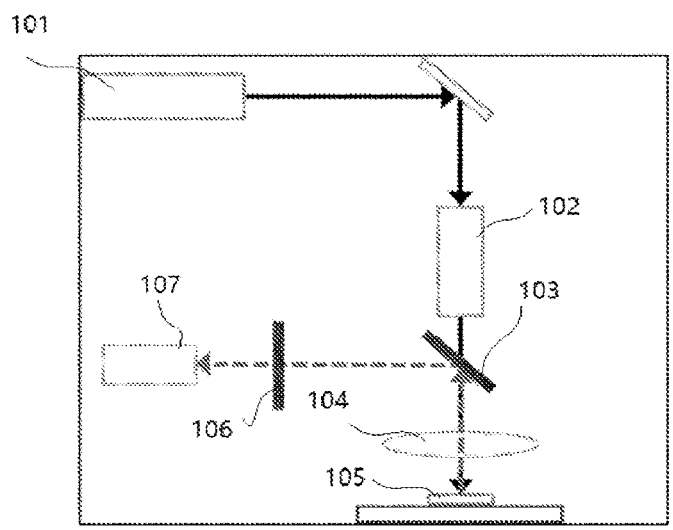
FIG. 1 shows a structural diagram of a two-photon fluorescence microscope.

In the related technology, generally, cathodoluminescence (CL) is used to test a GaN surface image. Since the dislocation positions do not emit light and are presented as dark spots on the image, the calculated dark spot density is the threading dislocation density;

In the present disclosure, a two-photon or multi-photon excitation photoluminescence image is used to test the GaN surface image (refer to non-patent document 2). The basic principle is: under the condition of meeting a certain high photon density, the electrons in GaN can absorb two photons having a long wavelength at the same time in a very short time (about $10^{-18}$ s), thereby transitioning from a ground state to an excited state, and after energy relaxation, returning from the excited state to the ground state and emitting a photon having a shorter wavelength. FIG. 1 shows a structural diagram of a two-photon fluorescence microscope. Because the condition of a high photon density needs to be met, the laser used in the two-photon fluorescence microscope is generally a femtosecond pulse laser having high instantaneous power and low average power. The imaging process of the two-photon fluorescence microscope is as follows: after a femtosecond pulse laser 101 emits laser light, and the beam is expanded by a beam expander 102, and after passing through a dichroic mirror 103, is focused onto a surface of a sample 105 by an objective lens 104. After the sample 105 is excited to emit fluorescent light, the light is reflected by the dichroic mirror 103 through the objective lens 104 and filtered by a filter 106, and a fluorescence signal carrying sample information is finally detected by a detector 107 to achieve the imaging of an object. Two-photon imaging technology is used to study the evolution of dislocations inside GaN. Since the dislocations inside GaN are non-radiative recombination centers, when threading dislocations exist in the sample, non-equilibrium carriers are greatly reduced due to non-radiative recombination, and no photons are emitted from the dislocation centers. Therefore, dislocation lines are presented as black lines on a two-photon image. The dislocation density of the GaN material can be quantitatively obtained by calculating the number of the black lines per unit area. In addition, by detecting the two-photon image at different depths inside the GaN material, a three-dimensional image can be constructed. This opens up a way for us to intuitively observe the generation and evolution of the dislocations in GaN.

Figure 2:
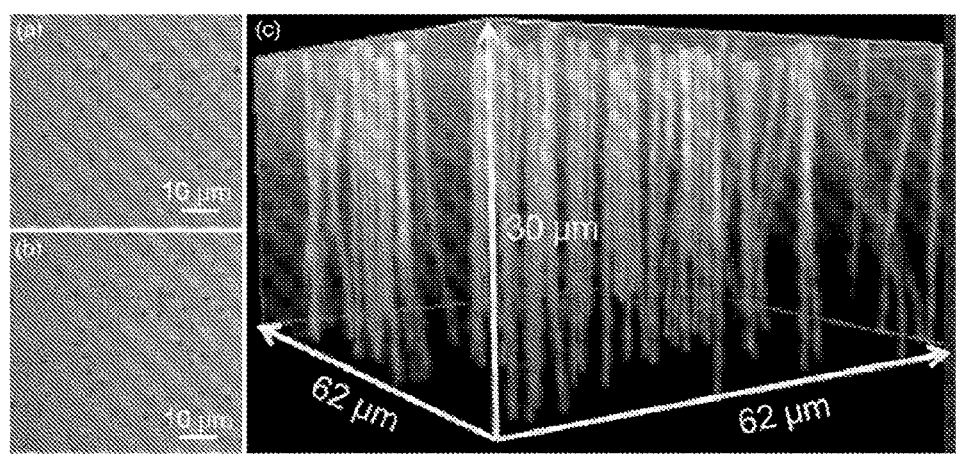
FIG. 2 is a two-photon excitation photoluminescence image of a typical free-standing GaN substrate.

FIG. 2 is a two-photon excitation photoluminescence image of a typical free-standing GaN substrate. As shown in FIG. 2, (a) is an excitation photoluminescence image of the outermost surface of the GaN substrate, the black lines in the drawing is threading dislocations, and by calculating the density of the black lines, the threading dislocation density can be obtained. (b) is an excitation photoluminescence image at a depth of 30 μm. (c) is a three-dimensional synthetic image. The images tested at different depths are synthesized to construct a three-dimensional image. The distribution of threading dislocations in the GaN substrate can be clearly seen, and the main threading dislocations are mixed dislocations having a certain tilt angle. Thus, threading dislocation tilt angles can be calculated.

Figure 3:
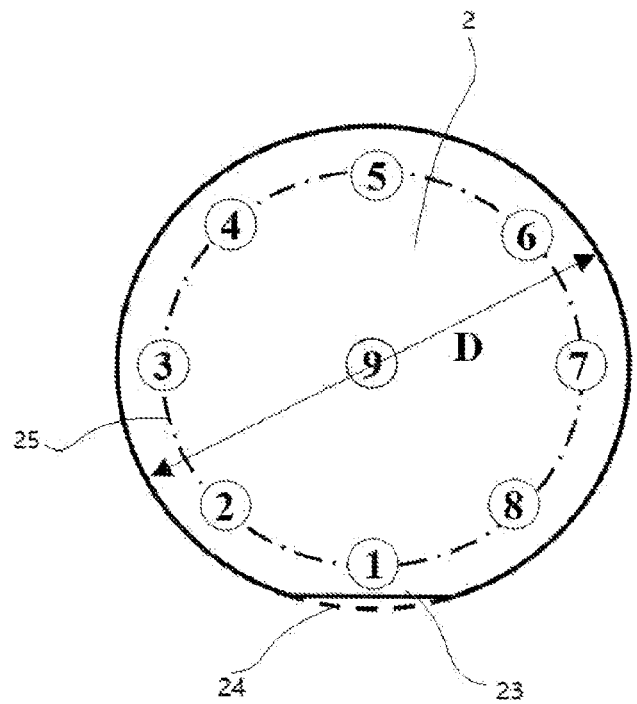
FIG. 3 shows a schematic diagram of a surface of a free-standing GaN substrate according to a first embodiment.

Calculation methods for the threading dislocation tilt angles $\alpha_{\Phi 1}$, threading dislocation densities $\rho_{TD\Phi 1}$, an average value $Ave[\rho_{TD\Phi 1}*\tan(\alpha_{\Phi 1})]$ of products of the threading dislocation densities and tangent values of the threading dislocation tilt angles, and uniformity $\Delta/Ave[\rho_{TD\Phi 1}*\tan(\alpha_{\Phi 1})]$ of the products of the threading dislocation densities and the tangent values of the threading dislocation tilt angles are as follows:

FIG. 3 shows a schematic diagram of a surface of a free-standing GaN substrate according to a first embodiment. The diameter D of the free-standing GaN substrate 2 is 50 mm (the diameter is the diameter of a dotted circle 24 when an orientation flat 23 is not used in FIG. 3), and a circle 25 concentric with the dotted circle 24 is a circle 5 mm inward from the dotted circle 24 on the outer periphery of the free-standing GaN substrate 2. On the dotted circle 24, eight points 1-8 are taken at an equal interval, and the eight points are combined with the ninth point (the center of the dotted circle 24), where the straight line where points 5, 9, and 1 are located and the line where points 3, 9, and 7 are located respectively form mutually orthogonal lines, and the line formed by points 5, 9, and 1 is perpendicular to the orientation flat 23. Taking the nine points as centers, circles having a diameter of 1 mm are constructed, a multi-photon excitation photoluminescence image is formed in the circles, and a three-dimensional dislocation image in a certain length, width and depth range is measured.

In the interior of Φ1 (in a circle having a diameter of 1 mm), first, the threading dislocation density $\rho_{TD\Phi 1}$ is obtained; and then for each obtained threading dislocation, its tilt angle α is calculated, and an average value $\alpha_{\Phi 1}$ of the tilt angles of all threading dislocations is obtained.

In the interior of ΦD (in a circle having a diameter of 50 mm), nine positions are tested, products $\rho_{TD\Phi 1}*\tan(\alpha_{\Phi 1})$ of threading dislocation densities at the nine point positions and tangent values of threading dislocation tilt angles are obtained respectively, so as to obtain its average value $Ave[\rho_{TD\Phi D}*\tan(\alpha_{\Phi D})]$ and further a quotient (uniformity of nine product values) of a difference between a maximum value and a minimum value of the products of the threading dislocation densities and the tangent values of the threading dislocation tilt angles divided by the average value:

$$\Delta/Ave[\rho_{TD\Phi D}*\tan(\alpha_{\Phi D})] = \{Max[\rho_{TD\Phi 1-9}*\tan(\alpha_{\Phi 1-9})] - Min[\rho_{TD\Phi 1-9}*\tan(\alpha_{\Phi 1-9})]\}/Ave[\rho_{TD\Phi D}*\tan(\alpha_{\Phi D})].$$

Figure 4:
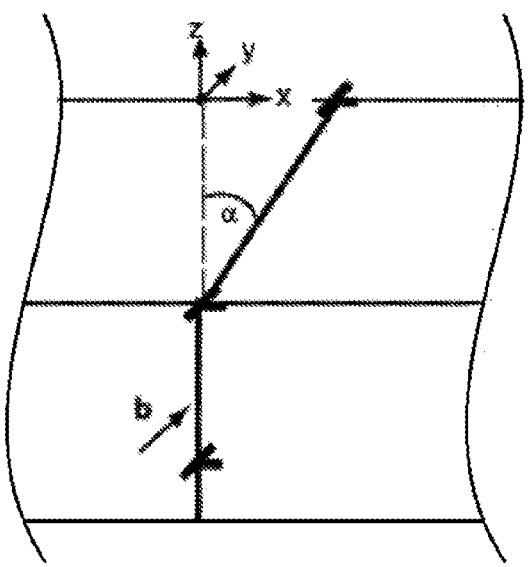
FIG. 4 is a schematic diagram of formation of tilt dislocations.

Non-patent document 1 elaborates on the effect of threading dislocations on the stress of GaN crystals: as shown in FIG. 4, a straight threading dislocation bends at an interface, a bending angle is α, and then a dislocation length projected in an X direction is $L=h\tan(\alpha)$, where h is the thickness of upper GaN and α is a threading dislocation tilt angle. The overall average stress of the GaN crystals is $\varepsilon_{pl}=\frac{1}{4}*b\rho_{TD}h\tan(\alpha)$, where b is the Burgers vector of the dislocation and $\rho_{TD}$ is the threading dislocation density. Hence, the stress in GaN has a linear proportional relationship with the threading dislocation density, and has a tangent function relationship with the threading dislocation tilt angle (that is, when the angle increases, the stress increases greatly). When there is a relatively large threading dislocation density or a relatively large threading dislocation tilt angle locally in GaN, there is relatively large stress in this local region. In the process of performing substrate separation, shape processing, or grinding and polishing on an HVPE-grown GaN crystal or in the process of epitaxially fabricating a related device on a substrate, cracking of the GaN substrate is likely to occur in the region having relatively high local stress. When the overall threading dislocation density in GaN is relatively large or the threading dislocation tilt angle is relatively large, there is relatively large stress in the whole sample. When substrate separation, shape processing, or grinding and polishing is performed on the HVPE-grown GaN crystal or when a device structure is epitaxially grown on the substrate, GaN substrate fragments are likely to occur when the overall stress is relatively large.

Therefore, in the present disclosure, use of the two parameters, that is, the average value $Ave[\rho_{TD\Phi 1}*\tan(\alpha_{\Phi 1})]$ of the products of the threading dislocation densities and the tangent values of the threading dislocation tilt angles and the quotient $\Delta/Ave[\rho_{TD\Phi 1}*\tan(\alpha_{\Phi 1})]$ of the difference between the maximum value and minimum value of the products of the threading dislocation densities and the tangent values of the threading dislocation tilt angles divided by the average value to characterize the defects of the gallium nitride substrate makes the internal stress of the gallium nitride substrate more real. In particular, after the inventor's research, when the produced gallium nitride substrate has good epitaxial performance when the values of the above two parameters are limited within a certain range, the GaN substrate obtained thereby or the epitaxial wafer fabricated on the GaN substrate is not easy to crack and break.

Specifically, in a GaN substrate according to an embodiment of the present disclosure, the gallium nitride substrate has a surface having a diameter not less than 50 mm, nine circular regions having a diameter not greater than 1 mm are taken on the surface, and the nine circular regions are located at the center position and eight surrounding positions on the surface of the GaN substrate. The average value of the products of the threading dislocation densities and the tangent values of the threading dislocation tilt angles calculated in the multi-photon excitation photoluminescence spectrum of the nine circular regions is not greater than 1E6 $cm^{-2}$, and the quotient of the difference between the maximum value and the minimum value of the products of the threading dislocation densities and the tangent values of the threading dislocation tilt angles divided by the average value is not greater than 50%.

As a preferred implementation mode, the gallium nitride substrate of the present disclosure has a surface having a diameter not less than 100 mm, nine circular regions having a diameter not greater than 1 mm is taken on the surface, and the average value of the products of the threading dislocation densities and the tangent values of the threading dislocation tilt angles calculated in the multi-photon excitation photoluminescence spectrum in the nine circular regions is not greater than 5E5 $cm^{-2}$. Further, the quotient of the difference between the maximum value and the minimum value of the products of the threading dislocation densities of the nine circular regions and the tangent values of the threading dislocation tilt angles divided by the average value is not greater than 40%.

In the nine circular regions, the eight circular regions located at the edge are distributed on the same circumference at an equal interval.

The present disclosure further provides a semiconductor composite substrate using the above gallium nitride substrate as a supporting substrate and fabricated by means of an epitaxy process.

An implementation mode is exemplified below for obtaining the GaN substrate of the present disclosure. The following manufacturing method is only a preferred method to obtain the GaN substrate, but is not the only method for manufacturing the GaN defined in the present disclosure. For a person skilled in the art, it should be understood that solutions obtained by other technical means and having the characteristics of the gallium nitride substrate defined in the present disclosure also fall within the scope of the inventive spirit of the present disclosure.

Figure 5A:
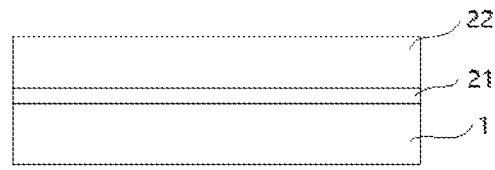
FIG. 5a to FIG. 5d are schematic diagrams of a method for fabricating a free-standing substrate according to the first embodiment.

Referring to the schematic diagrams of FIG. 5a to FIG. 5d, a schematic method for fabricating a free-standing GaN substrate according to the first embodiment is described:

As shown in FIG. 5a, a GaN thick film 22 having a certain thickness is first grown on a substrate 1 using HVPE. In this process, non-periodic structure epitaxial growth is directly performed on the substrate, that is, in the growth process, a formula is used for epitaxial growth for a period of time. A GaN template, sapphire, silicon carbide, silicon, or the like is selected as the substrate 1. A preferred solution is to use a GaN template as a homo-substrate for epitaxy, so that a gallium nitride substrate having better quality can be obtained. The GaN template can be obtained by using a metal organic chemical vapor deposition system to grow a GaN thin film 21 substrate having a thickness greater than 2 µm on sapphire, and only dislocation density screening is performed on the substrate or a surface of micro- or nano-columns is formed by means of electrochemical corrosion, but a periodic mask structure is not formed.

Figure 5B:
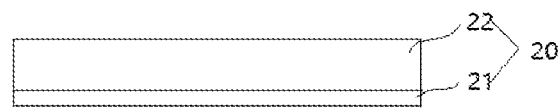

Next, as shown in FIG. 5b, the substrate 1 is separated from a GaN crystal 20 (including the GaN thin film 21 and the GaN thick film 22), and the specific solution may be laser lift-off, mechanical grinding, chemical corrosion and so on.

Figure 5C:
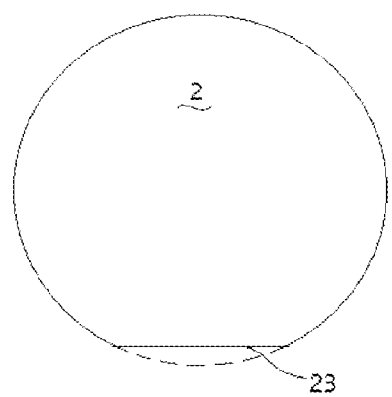

Next, as shown in FIG. 5c, the separated free-standing GaN crystal 20 forms a specific circle having an orientation flat 23 by means of shape processing, then the surface is flattened by means of plane grinding, and then the surface is polished, thereby obtaining the free-standing GaN substrate 2 according to the first embodiment.

Figure 5D:
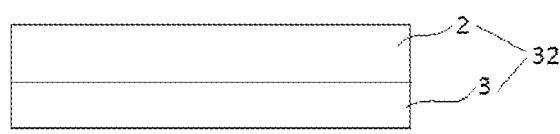

In addition, as shown in FIG. 5d, the free-standing GaN substrate 2 can be bonded to the surface of a hetero-substrate 3, which may be sapphire, silicon carbide, silicon, aluminum nitride and so on, so as to produce a composite substrate 32. A bonding method is not limited, metal bonding, fusion bonding, etc. may be used, and metal bonding is preferred.

Epitaxial growth of GaN on sapphire belongs to heteroepitaxy. A low-temperature buffer layer is grown first, and then a high-temperature layer is grown. Epitaxial growth of GaN on a substrate having a GaN layer belongs to homoepitaxy and growth at high temperature can be performed directly. Moreover, the advantages of the fabrication method in the above implementation are:

1. The biggest advantage of HVPE over MOCVD is a high growth rate. Generally, the growth rate of HVPE is 50-200 um/h, and the growth rate of MOCVD is 0.5-5 um/h. Therefore, in the process of heteroepitaxial growth, the growth mode of a growth interface of HVPE is not easy to control relative to MOCVD, resulting in more severe degree of bending of threading dislocations than MOCVD. Therefore, use of an MOCVD-grown GaN template as the substrate is more beneficial to control of tilt angles of the threading dislocations in HYPE-grown GaN.
2. Use of the MOCVD-grown GaN template grown having different dislocation densities can effectively control threading dislocation densities of the HYPE-grown GaN.
3. The high growth rate is beneficial to the production efficiency of a GaN thick film, but it also causes the threading dislocations in GaN to tilt more easily.
4. Electrochemical corrosion of the MOCVD-grown GaN template can effectively reduce the threading dislocation density of an HVPE-grown GaN thick film. The principle is that during electrochemical corrosion, the corrosion starts from positions having dislocation defects, therefore, micro- or nano-columns are formed on the GaN template after corrosion, there are basically no dislocations in the micro- or nano-columns, and the HVPE-grown GaN thick film on a substrate having no dislocations has a low threading dislocation density.

In conclusion, combining the four technical means 1-4, HYPE-growth of a GaN thick film having a low threading dislocation density and threading dislocations having a small tilt angle is facilitated, and the free-standing GaN substrate fabricated thereby has relatively low stress. Thus, cracking and fragments are suppressed during processing of the GaN substrate or in the process of epitaxially fabricating a related device thereon.

Second Embodiment

The second embodiment differs from the first embodiment in that:

The free-standing GaN substrate 2 has a diameter not less than 100 mm.

In the interior of $\Phi 1$ (in a circle having a diameter of 1 mm), first, the threading dislocation density $\rho_{TD\Phi 1}$ is obtained; and then for each obtained threading dislocation, its tilt angle $\alpha$ is calculated, and an average value $\alpha_{\Phi 1}$ of the tilt angles of all threading dislocations is obtained.

In the interior of $\Phi D$ (in a circle having a diameter of 100 mm), nine positions are tested, products $\rho_{TD\Phi 1}*\tan(\alpha_{\Phi 1})$ of threading dislocation densities at the nine point positions and tangent values of threading dislocation tilt angles are obtained respectively, and its average value $\text{Ave}[\rho_{TD\Phi D}*\tan(\alpha_{\Phi D})]$ is set to not greater than 5E5 cm$^{-2}$; and a quotient (uniformity of nine product values) $\Delta/\text{Ave}[\rho_{TD\Phi D}*\tan(\alpha_{\Phi D})]$ of a difference between a maximum value and a minimum value of the products of the threading dislocation densities and the tangent values of the threading dislocation tilt angles divided by the average value is set to not greater than 40%.

In the second embodiment, the diameter D of the free-standing GaN substrate 2 is larger than that in the first embodiment, and therefore, cracking or fragments are easier to occur. In this case, by controlling $\text{Ave}[\rho_{TD\Phi D}*\tan(\alpha_{\Phi D})]$ to be not greater than 5E5 cm$^{-2}$ and $\Delta/\text{Ave}[\rho_{TD\Phi D}*\tan(\alpha_{\Phi D})]$ to be not greater than 40%, cracking or fragments of the GaN substrate can be effectively suppressed. Except for the above difference, the second embodiment is the same as the first embodiment, and details are not described again.

Comparative Embodiment 1

Sapphire having a diameter of 55 mm is used as a substrate, and GaN is directly grown using HYPE. The specific method is as follows: first, the sapphire substrate is placed in a high-temperature and constant-temperature region of a tubular resistance furnace, and HCl gas enters a low-temperature and constant-temperature region (850 degrees) of the tubular resistance furnace through $N_2/H_2$ mixed gas at a certain ratio as carrier gas, reacts with metal gallium to generate GaCl gas, then enters the high-temperature and constant-temperature region, and reacts with $NH_3$ gas to generate GaN on the substrate. First, the temperature of the high-temperature and constant-temperature region is set to 650 degrees, a low-temperature GaN buffer layer of about 50-100 nm is grown, then the temperature is increased to 1040 degrees for further growth for about 10 hours, and the growth rate is controlled to a low rate (<100 um/h) to obtain a GaN thick film having a thickness of about 800 μm.

Then, the substrate is separated from the GaN thick film by means of laser lift-off technology, the separated free-standing GaN crystal forms a specific circle having an orientation flat by means of shape processing, then the surface is flattened by means of plane grinding, and then the surface is polished, so as to obtain the free-standing GaN substrate of comparative embodiment 1. The diameter of the substrate is controlled at 50 mm and the thickness is controlled at 400 μm.

Next, two-photon excitation photoluminescence testing is performed on the free-standing GaN substrate. A femtosecond pulse laser having a wavelength of 700 nm, a pulse duration of 100 fs, a frequency of 10 ns, and high instantaneous power is used, and a water immersion lens having a magnification of 40 times is used as an objective lens. Images within a certain range are tested. By detecting the same position from a surface to a depth range of tens of μm inside, and a test step of one image is acquired every 1 μm, so that a three-dimensional image can be constructed. For the convenience of observation, we invert the contrast of the three-dimensional image. In the successfully constructed three-dimensional image of the free-standing GaN substrate, actually measured dark lines are displayed as bright lines, and the bright lines are threading dislocations. Thus, the distribution of threading dislocations in the GaN substrate can be clearly seen, and the main threading dislocations are mixed dislocations having a certain tilt angle, and thus, the threading dislocation density and tilt angles can be calculated.

Then, a two-photon excitation photoluminescence image is respectively tested at nine point positions on the free-standing GaN substrate to obtain nine three-dimensional dislocation images. Calculation is performed on each three-dimensional dislocation image. As shown in table 1.1 to table 1.4, first, threading dislocation densities $\rho_{TD\Phi 1}$ are obtained; and then, a tilt angle α of each threading dislocation is obtained, and an average value $\alpha_{\Phi 1}$ of the tilt angles of all the threading dislocations is calculated. Then statistical analysis is performed on data of the nine three-dimensional dislocation images, products $\rho_{TD\Phi 1}*\tan(\alpha_{\Phi 1})$ of the threading dislocation densities at the nine point positions and tangent values of the threading dislocation tilt angles are obtained respectively, and the average value $\text{Ave}[\rho_{TD\Phi 1}*\tan(\alpha_{\Phi 1})]$ and a quotient (uniformity of nine product values) $\Delta/\text{Ave}[\rho_{TD\Phi 1}*\tan(\alpha_{\Phi 1})]$ of a difference between a maximum value and a minimum value of the products of the threading dislocation densities and the tangent values of the threading dislocation tilt angles divided by the average value are obtained. The result is shown in table 1.

Comparative Embodiment 2

Comparative embodiment 2 differs from comparative embodiment 1 in that: the growth rate of an HVPE-grown GaN thick film is controlled to a high rate (>150 um/h), and a GaN thick film having a thickness of about 800 μm is obtained by growing at a high temperature of 1040 degrees for 5 hours. Except for the above difference, comparative embodiment 2 is the same as comparative embodiment 1, and details are not described again.

Comparative Embodiment 3

Comparative embodiment 3 differs from comparative embodiment 1 in that:
(1) A GaN template having a dislocation density of 5E8 $cm^{-2}$ is used as a substrate 1.
(2) In a growth process, a GaN thick film is directly grown at a high temperature of 1040 degrees, and there is no a 650-degree low-temperature GaN buffer layer growth process. Except for the above difference, comparative embodiment 3 is the same as comparative embodiment 1, and details are not described again.

Comparative embodiment 4 differs from comparative embodiment 2 in that:
(1) A GaN template having a dislocation density of 5E8 $cm^{-2}$ is used as a substrate 1.
(2) In a growth process, a GaN thick film is directly grown at a high temperature of 1040 degrees, and there is no a 650-degree low-temperature GaN buffer layer growth process. Except for the above difference, comparative embodiment 4 is the same as comparative embodiment 2, and details are not described again.

Comparative embodiment 5 differs from comparative embodiment 3 in that: a GaN template having a dislocation density of 7E7 $cm^{-2}$ is used as a substrate 1. Except for the above difference, comparative embodiment 5 is the same as comparative embodiment 3, and details are not described again.

Comparative embodiment 6 differs from comparative embodiment 4 in that: a GaN template having a dislocation density of 7E7 $cm^{-2}$ is used as a substrate 1. Except for the above difference, comparative embodiment 6 is the same as comparative embodiment 4, and details are not described again.

Comparative embodiment 7 differs from comparative embodiment 3 in that: electrochemical corrosion is performed on a substrate 1 first. For details, reference may be made to the company's original patent CN102163545A. Since the corrosion starts from the dislocations of a GaN template, the dislocation density in the GaN micro-columns (nano-columns) formed after the corrosion is extremely low, and a GaN thick film having a relatively low threading dislocation density can be obtained. Except for the above difference, comparative embodiment 7 is the same as comparative embodiment 3, and details are not described again.

Comparative embodiment 8 differs from comparative embodiment 4 in that: electrochemical corrosion is performed on a substrate 1 first. For details, reference may be made to the company's original patent CN102163545A. Since the corrosion starts from the dislocations of a GaN template, the dislocation density in the GaN micro-columns (nano-columns) formed after the corrosion is extremely low, and a GaN thick film having a relatively low threading dislocation density can be obtained. Except for the above difference, comparative embodiment 8 is the same as comparative embodiment 4, and details are not described again.

Comparative embodiment 9 differs from comparative embodiment 5 in that: electrochemical corrosion is performed on a substrate first. For details, reference may be made to the company's original patent CN102163545A.

Since the corrosion starts from the dislocations of a GaN template, the dislocation density in the GaN micro-columns (nano-columns) formed after the corrosion is extremely low, and a GaN thick film having a relatively low threading dislocation density can be obtained. Except for the above difference, comparative embodiment 9 is the same as comparative embodiment 5, and details are not described again.

Comparative embodiment 10 differs from comparative embodiment 6 in that: electrochemical corrosion is performed on a substrate first. For details, reference may be made to the company's original patent CN102163545A. Since the corrosion starts from the dislocations of a GaN template, the dislocation density in the GaN micro-columns (nano-columns) formed after the corrosion is extremely low, and a GaN thick film having a relatively low threading dislocation density can be obtained. Except for the above difference, comparative embodiment 10 is the same as comparative embodiment 6, and details are not described again.

Evaluation is performed on fabrication of a related device by means of processing, such as substrate separation, shape processing, or grinding and polishing and epitaxy:

Embodiments 1-10 are evaluated. In embodiments 1, 2, and 4, fragmentation occurs during processing; and in Embodiments 3 and 6, cracking occurs during processing (the occurrence of fragmentation or cracking does not affect testing. However, epitaxial fabrication of the related device is no longer performed). Cracking means that the number of cracks is less than three, and fragmentation means that the number of cracks is three or more.

In embodiments 5, 7, 8, 9, and 10, a laser structure is epitaxially grown using MOCVD, and the specific structure is shown in FIG. 6. The growth conditions are: trimethylgallium, trimethylaluminum, trimethylindium, and magnesocene are used as source materials of gallium, aluminum, indium, and magnesium; $NH_3$ is used as a nitrogen source material; and silane gas is used as a doping source, and $H_2$ is used as carrier gas and is introduced into a cold-wall heating system, so as to epitaxially grow a device structure on a free-standing GaN substrate. Then, the surface situations of the embodiments after epitaxial growth are observed, and the results are shown in table 1.1 to table 1.4. Cracking occurs on the surface of embodiment 8. As seen from the above results, the overall stress of the free-standing GaN substrate 2 of $\text{Ave}[\rho_{TD\Phi D}*\tan(\alpha_{\Phi D})] > 1E6 \text{ cm}^{-2}$ is relatively large, and thus fragmentation is easy to occur during processing; and the local stress of the free-standing GaN substrate 2 of $\Delta/\text{Ave}[\rho_{TD\Phi D}*\tan(\alpha_{\Phi D})] > 50\%$ is relatively large, and thus cracking is easy to occur during processing, and even if no cracking occurs during processing, cracking is easy to occur after further epitaxy of the related device.

Comparative Embodiment 11

Based on the control situation of the GaN substrate having a diameter of 50 mm (comparative embodiment 1-10), solutions 1-4, 6, and 8 are no longer used during the fabrication of the GaN substrate having a diameter not less than 100 mm. In this embodiment, a GaN template having a diameter of 105 mm and a dislocation density of $7E7 \text{ cm}^{-2}$ is used as the substrate 1, and a GaN thick film is directly grown using HYPE. The growth method is similar to that of comparative embodiment 5, and the difference lies in that a GaN thick film having a thickness controlled to about 1000 μm is grown. Then, the substrate is separated from the GaN thick film by means of laser lift-off technology, the separated free-standing GaN crystal forms a specific circle having an orientation flat by means of shape processing, then the surface is flattened by means of plane grinding, and then the surface is polished, so as to obtain the free-standing GaN substrate of comparative embodiment 11. The diameter of the substrate is controlled at 100 mm and the thickness is controlled at 600 μm.

Next, two-photon excitation photoluminescence testing is performed on the free-standing GaN substrate. The test method is the same as that of comparative embodiment 1. Then, a two-photon excitation photoluminescence image is respectively tested at nine point positions on the free-standing GaN substrate to obtain nine three-dimensional dislocation images. Calculation is performed on each three-dimensional dislocation image. As shown in table 2.1 to table 2.2, first, threading dislocation densities $\rho_{TD\Phi1}$ are obtained; and then, a tilt angle α of each threading dislocation is obtained, and an average value $\alpha_{\Phi1}$ of the tilt angles of all the threading dislocations is calculated. Then statistical analysis is performed on data of the nine three-dimensional dislocation images, products $\rho_{TD\Phi1}*\tan(\alpha_{\Phi1})$ of the threading dislocation densities at the nine point positions and tangent values of the threading dislocation tilt angles are obtained respectively, and the average value $\text{Ave}[\rho_{TD\Phi D}*\tan(\alpha_{\Phi D})]$ and a quotient (uniformity of nine product values) $\Delta/\text{Ave}[\rho_{TD\Phi D}*\tan(\alpha_{\Phi D})]$ of a difference between a maximum value and a minimum value of the products of the threading dislocation densities and the tangent values of the threading dislocation tilt angles divided by the average value are obtained. Table 2.1 to table 2.2 show the results of embodiments 11-14.

Comparative Embodiment 12

Comparative embodiment 12 differs from comparative embodiment 11 in that: a GaN template having a dislocation density of $5E8 \text{ cm}^{-2}$ is used as a substrate 1, electrochemical corrosion is performed on the substrate 1 first. For details, reference may be made to the company's original patent CN102163545A. Since the corrosion starts from the dislocations of a GaN template, the dislocation density in the GaN micro-columns (nano-columns) formed after the corrosion is extremely low, and a GaN thick film having a relatively low threading dislocation density can be obtained. Except for the above difference, comparative embodiment 12 is the same as comparative embodiment 11, and details are not described again.

Comparative Embodiment 13

Comparative embodiment 13 differs from comparative embodiment 12 in that: a GaN template having a dislocation density of $7E7 \text{ cm}^{-2}$ is used as a substrate 1. Except for the above difference, comparative embodiment 13 is the same as comparative embodiment 12, and details are not described again.

Comparative Embodiment 14

Comparative embodiment 14 differs from comparative embodiment 13 in that: the growth rate of an HVPE-grown GaN thick film is controlled to a high rate (>150 um/h), and a GaN thick film having a thickness of about 1000 μm is obtained by growing at a high temperature of 1040 degrees for 6 hours. Except for the above difference, comparative embodiment 14 is the same as comparative embodiment 13, and details are not described again.

Evaluation is performed on fabrication of a related device by means of processing, such as substrate separation, shape processing, or grinding and polishing and epitaxy:

Embodiments 11-14 are evaluated. In the embodiment 11, fragmentation occurs during processing; and in the embodiment 14, cracking occurs during processing (the occurrence of fragmentation or cracking does not affect testing. However, epitaxial fabrication of the related device is no longer performed).

In embodiments 12 and 13, a laser structure is epitaxially grown using MOCVD, and the specific structure is shown in FIG. 6. The growth conditions are: trimethylgallium, trimethylaluminum, trimethylindium, and magnesocene are used as source materials of gallium, aluminum, indium, and magnesium; $NH_3$ is used as a nitrogen source material; and silane gas is used as a doping source, and $H_2$ is used as carrier gas and is introduced into a cold-wall heating system, so as to epitaxially grow a device structure on a free-standing GaN substrate. Then, the surface situations of the embodiments after epitaxial growth are observed, and the results are shown in table 2.1 to table 2.2. Cracking occurs on the surface of embodiment 12. As seen from the above results, the overall stress of the free-standing GaN substrate 2 of $Ave[\rho_{TD\Phi1}*\tan(\alpha_{\Phi D})]>5E5$ is relatively large, and thus fragmentation is easy to occur during processing; and the local stress of the free-standing GaN substrate 2 of $\Delta/Ave[\rho_{TD\Phi D}*\tan(\alpha_{\Phi D})]>40\%$ is relatively large, and thus cracking is easy to occur during processing, and even if no cracking occurs during processing, cracking is easy to occur after further epitaxy of the related device.

TABLE 1.1

|  |  | Experimental example 1 | | | Experimental example 2 | | |
| --- | --- | --- | --- | --- | --- | --- | --- |
| | Diameter | 50 | | | 50 | | |
| Original substrate | Substrate structure | Sapphire | | | Sapphire | | |
| | Dislocation density | — | | | — | | |
| Initial growth condition | | Low-temperature buffer layer + high-temperature growth | | | Low-temperature buffer layer + high-temperature growth | | |
| Growth rate | | Low growth rate | | | High growth rate | | |
| Interior of $\Phi1$ | | $\alpha_{\Phi1}$ | $\rho_{TD\Phi1}$ | $\rho_{TD\Phi1}*\tan(\alpha_{\Phi1})$ | $\alpha_{\Phi1}$ | $\rho_{TD\Phi1}$ | $\rho_{TD\Phi1}*\tan(\alpha_{\Phi1})$ |
| Positions | 1 | 20.5 | 2.1E+06 | 7.9E+05 | 25.8 | 4.1E+06 | 2.0E+06 |
| | 2 | 21.3 | 4.8E+06 | 1.9E+06 | 27.4 | 4.5E+06 | 2.3E+06 |
| | 3 | 25.4 | 5.7E+06 | 2.7E+06 | 25.4 | 5.5E+06 | 2.6E+06 |
| | 4 | 18.9 | 5.4E+06 | 1.8E+06 | 28.4 | 5.3E+06 | 2.9E+06 |
| | 5 | 19.3 | 6.4E+06 | 2.2E+06 | 26.3 | 6.2E+06 | 3.1E+06 |
| | 6 | 23.4 | 6.6E+06 | 2.9E+06 | 29.3 | 6.6E+06 | 3.7E+06 |
| | 7 | 25.3 | 5.6E+06 | 2.6E+06 | 26.7 | 4.6E+06 | 2.3E+06 |
| | 8 | 24.7 | 5.5E+06 | 2.5E+06 | 25.7 | 5.5E+06 | 2.6E+06 |
| | 9 | 23.1 | 4.7E+06 | 2.0E+06 | 25.4 | 3.2E+06 | 1.5E+06 |
| Interior of $\Phi D$ | | $Ave[\rho_{TD\Phi D}*\tan(\alpha_{\Phi D})]$ 2.2E+06 | | | $Ave[\rho_{TD\Phi D}*\tan(\alpha_{\Phi D})]$ 2.6E+06 | | |
| | | $\Delta/Ave[\rho_{TD\Phi D}*\tan(\alpha_{\Phi D})]$ 96% | | | $\Delta/Ave[\rho_{TD\Phi D}*\tan(\alpha_{\Phi D})]$ 85% | | |
| Processing situation | | Fragmentation | | | Fragmentation | | |
| Situation after epitaxy of a device | | — | | | — | | |

TABLE 1.2

|  |  | Experimental example 3 | | | Experimental example 4 | | | Experimental example 5 | | |
| --- | --- | --- | --- | --- | --- | --- | --- | --- | --- | --- |
| | Diameter | 50 | | | 50 | | | 50 | | |
| Original substrate | Substrate structure | GaN template | | | GaN template | | | GaN template | | |
| | Dislocation density | 5.0E+08 | | | 5.0E+08 | | | 7.0E+07 | | |
| Initial growth condition | | Direct high-temperature growth | | | Direct high-temperature growth | | | Direct high-temperature growth | | |
| Growth rate | | Low growth rate | | | High growth rate | | | Low growth rate | | |
| Interior of $\Phi1$ | | $\alpha_{\Phi1}$ | $\rho_{TD\Phi1}$ | $\rho_{TD\Phi1}*\tan(\alpha_{\Phi1})$ | $\alpha_{\Phi1}$ | $\rho_{TD\Phi1}$ | $\rho_{TD\Phi1}*\tan(\alpha_{\Phi1})$ | $\alpha_{\Phi1}$ | $\rho_{TD\Phi1}$ | $\rho_{TD\Phi1}*\tan(\alpha_{\Phi1})$ |
| Positions | 1 | 16.4 | 2.4E+06 | 7.1E+05 | 28.3 | 2.1E+06 | 1.1E+06 | 15.8 | 8.0E+05 | 2.3E+05 |
| | 2 | 15.3 | 2.4E+06 | 6.6E+05 | 28.9 | 2.5E+06 | 1.4E+06 | 15.7 | 7.6E+05 | 2.1E+05 |
| | 3 | 17.8 | 2.5E+06 | 8.0E+05 | 26.4 | 2.2E+06 | 1.1E+06 | 17.4 | 6.1E+05 | 1.9E+05 |
| | 4 | 18.9 | 1.9E+06 | 6.5E+05 | 26.5 | 1.8E+06 | 9.0E+05 | 15.7 | 6.7E+05 | 1.9E+05 |
| | 5 | 16.4 | 2.1E+06 | 6.2E+05 | 27.8 | 1.7E+06 | 8.8E+05 | 16.8 | 8.4E+05 | 2.5E+05 |
| | 6 | 15.3 | 1.2E+06 | 3.3E+05 | 26.1 | 2.0E+06 | 9.8E+05 | 16.1 | 8.6E05 | 2.5E+05 |
| | 7 | 12.4 | 1.6E+06 | 3.5E+05 | 29.3 | 2.4E+06 | 1.3E+06 | 13.1 | 7.9E+05 | 1.8E+05 |
| | 8 | 17.8 | 2.6E+06 | 8.3E+05 | 27.3 | 2.1E+06 | 1.1E+06 | 13.6 | 6.7E+05 | 1.6E+05 |
| | 9 | 13.7 | 2.4E+06 | 5.9E+05 | 29.3 | 2.8E+06 | 1.6E+06 | 13.5 | 8.0E+05 | 1.9E+05 |

TABLE 1.2-continued

|  | Experimental example 3 | Experimental example 4 | Experimental example 5 |
|---|---|---|---|
| Interior of ΦD | Ave[$\rho_{TD\Phi D}$*tan($\alpha_{\Phi D}$)]<br>6.1E+05 | Ave[$\rho_{TD\Phi D}$*tan($\alpha_{\Phi D}$)]<br>1.2E+06 | Ave[$\rho_{TD\Phi D}$*tan($\alpha_{\Phi D}$)]<br>2.1E+05 |
|  | Δ/Ave[$\rho_{TD\Phi D}$*tan($\alpha_{\Phi D}$)]<br>82% | Δ/Ave[$\rho_{TD\Phi D}$*tan($\alpha_{\Phi D}$)]<br>60% | Δ/Ave[$\rho_{TD\Phi D}$*tan($\alpha_{\Phi D}$)]<br>44% |
| Processing situation | Cracking | Fragmentation | Excellent |
| Situation after epitaxy of a device | — | — | Excellent |

TABLE 1.3

|  |  | Experimental example 6 | | | Experimental example 7 | | |
|---|---|---|---|---|---|---|---|
| Original substrate | Diameter | 50 | | | 50 | | |
|  | Substrate structure | GaN template | | | GaN template | | |
|  | Dislocation density | 7.0E+07 | | | 5.0E+08 | | |
| Initial growth condition |  | Direct high-temperature growth | | | Electrochemical corrosion + high-temperature growth | | |
| Growth rate |  | High growth rate | | | Low growth rate | | |
| Interior of Φ1 |  | $\alpha_{\Phi 1}$ | $\rho_{TD\Phi 1}$ | $\rho_{TD\Phi 1}$*tan($\alpha_{\Phi 1}$) | $\alpha_{\Phi 1}$ | $\rho_{TD\Phi 1}$ | $\rho_{TD\Phi 1}$*tan($\alpha_{\Phi 1}$) |
| Positions | 1 | 28.1 | 8.7E+05 | 4.6E+05 | 15.5 | 4.7E+05 | 1.3E+05 |
|  | 2 | 25.4 | 6.9E+05 | 3.3E+05 | 14.7 | 5.8E+05 | 1.5E+05 |
|  | 3 | 26.3 | 7.7E+05 | 3.8E+05 | 16.5 | 4.7E+05 | 1.4E+05 |
|  | 4 | 24.5 | 7.3E+05 | 3.3E+05 | 17.8 | 4.6E+05 | 1.5E+05 |
|  | 5 | 25.4 | 6.5E+05 | 3.1E+05 | 17.5 | 4.3E+05 | 1.4E+05 |
|  | 6 | 25.8 | 8.7E+05 | 4.2E+05 | 17.6 | 5.6E+05 | 1.8E+05 |
|  | 7 | 24.5 | 5.6E+05 | 2.6E+05 | 13.6 | 5.4E+05 | 1.3E+05 |
|  | 8 | 27.2 | 9.5E+05 | 4.9E+05 | 16.9 | 5.5E+05 | 1.7E+05 |
|  | 9 | 26.7 | 7.6E+05 | 3.8E+05 | 15.6 | 5.1E+05 | 1.4E+05 |
| Interior of ΦD |  | Ave[$\rho_{TD\Phi D}$*tan($\alpha_{\Phi D}$)]<br>3.7E+05 | | | Ave[$\rho_{TD\Phi D}$*tan($\alpha_{\Phi D}$)]<br>1.5E+05 | | |
|  |  | Δ/Ave[$\rho_{TD\Phi D}$*tan($\alpha_{\Phi D}$)]<br>62% | | | Δ/Ave[$\rho_{TD\Phi D}$*tan($\alpha_{\Phi D}$)]<br>32% | | |
| Processing situation |  | Cracking | | | Excellent | | |
| Situation after epitaxy of a device |  | — | | | Excellent | | |

TABLE 1.4

|  |  | Experimental example 8 | | | Experimental example 9 | | | Experimental example 10 | | |
|---|---|---|---|---|---|---|---|---|---|---|
| Original substrate | Diameter | 50 | | | 50 | | | 50 | | |
|  | Substrate structure | GaN template | | | GaN template | | | GaN template | | |
|  | Dislocation density | 5.0E+08 | | | 7.0E+07 | | | 7.0E+07 | | |
| Initial growth condition |  | Electrochemical corrosion + high-temperature growth | | | Electrochemical corrosion + high-temperature growth | | | Electrochemical corrosion + high-temperature growth | | |
| Growth rate |  | High growth rate | | | Low growth rate | | | High growth rate | | |
| Interior of Φ1 |  | $\alpha_{\Phi 1}$ | $\rho_{TD\Phi 1}$ | $\rho_{TD\Phi 1}$*tan($\alpha_{\Phi 1}$) | $\alpha_{\Phi 1}$ | $\rho_{TD\Phi 1}$ | $\rho_{TD\Phi 1}$*tan($\alpha_{\Phi 1}$) | $\alpha_{\Phi 1}$ | $\rho_{TD\Phi 1}$ | $\rho_{TD\Phi 1}$*tan($\alpha_{\Phi 1}$) |
| Positions | 1 | 27.6 | 5.2E+05 | 2.7E+05 | 15.3 | 4.8E+05 | 1.3E+05 | 27.4 | 4.3E+05 | 2.2E+05 |
|  | 2 | 25.6 | 4.8E+05 | 2.3E+05 | 15.8 | 4.3E+05 | 1.2E+05 | 24.7 | 4.5E+05 | 2.1E+05 |
|  | 3 | 25.7 | 5.7E+05 | 2.7E+05 | 16.3 | 4.1E+05 | 1.2E+05 | 25.3 | 3.5E+05 | 1.7E+05 |
|  | 4 | 20.4 | 5.4E+05 | 2.0E+05 | 17.3 | 4.3E+05 | 1.3E+05 | 25.3 | 4.5E+05 | 2.1E+05 |
|  | 5 | 26.1 | 6.4E+05 | 3.1E+05 | 15.4 | 4.5E+05 | 1.2E+05 | 24.8 | 5.2E+05 | 2.4E+05 |
|  | 6 | 24.3 | 6.6E+05 | 3.0E+05 | 16.1 | 5.1E+05 | 1.5E+05 | 24.5 | 5.5E+05 | 2.5E+05 |
|  | 7 | 25.4 | 5.1E+05 | 2.4E+05 | 16.5 | 5.0E+05 | 1.5E+05 | 25.1 | 5.4E+05 | 2.5E+05 |
|  | 8 | 26.4 | 4.6E+05 | 2.3E+05 | 15.4 | 4.2E+05 | 1.2E+05 | 25.8 | 4.1E+05 | 2.0E+05 |
|  | 9 | 28.3 | 6.6E+05 | 3.6E+05 | 14.3 | 4.7E+05 | 1.2E+05 | 27.3 | 4.0E+05 | 2.1E+05 |
| Interior of ΦD |  | Ave[$\rho_{TD\Phi D}$*tan($\alpha_{\Phi D}$)]<br>2.7E+05 | | | Ave[$\rho_{TD\Phi D}$*tan($\alpha_{\Phi D}$)]<br>1.3E+05 | | | Ave[$\rho_{TD\Phi D}$*tan($\alpha_{\Phi D}$)]<br>2.2E+05 | | |
|  |  | Δ/Ave[$\rho_{TD\Phi D}$*tan($\alpha_{\Phi D}$)]<br>58% | | | Δ/Ave[$\rho_{TD\Phi D}$*tan($\alpha_{\Phi D}$)]<br>25% | | | Δ/Ave[$\rho_{TD\Phi D}$*tan($\alpha_{\Phi D}$)]<br>40% | | |

TABLE 1.4-continued

|  | Experimental example 8 | Experimental example 9 | Experimental example 10 |
|---|---|---|---|
| Processing situation | Excellent | Excellent | Excellent |
| Situation after epitaxy of a device | Cracking | Excellent | Excellent |

TABLE 2.1

| | | Experimental example 11 | | | Experimental example 12 | | |
|---|---|---|---|---|---|---|---|
| | Diameter | 100 | | | 100 | | |
| Original substrate | Substrate structure | GaN template | | | GaN template | | |
| | Dislocation density | 7.0E+07 | | | 5.0E+08 | | |
| Initial growth condition | | Direct high-temperature growth | | | Electrochemical corrosion + high-temperature growth | | |
| Growth rate | | Low growth rate | | | Low growth rate | | |
| Interior of Φ1 | | $\alpha_{\Phi 1}$ | $\rho_{TD\Phi 1}$ | $\rho_{TD\Phi 1}*\tan(\alpha_{\Phi 1})$ | $\alpha_{\Phi 1}$ | $\rho_{TD\Phi 1}$ | $\rho_{TD\Phi 1}*\tan(\alpha_{\Phi 1})$ |
| Positions | 1 | 20.1 | 1.4E+06 | 5.1E+05 | 22.1 | 9.3E+05 | 3.8E+05 |
| | 2 | 19.8 | 2.1E+06 | 7.6E+05 | 23.2 | 9.6E+05 | 4.1E+05 |
| | 3 | 21.3 | 1.7E+06 | 6.6E+05 | 18.1 | 7.6E+05 | 2.5E+05 |
| | 4 | 18.9 | 1.8E+06 | 6.2E+05 | 18.3 | 8.8E+05 | 2.9E+05 |
| | 5 | 19.5 | 1.9E+06 | 6.7E+05 | 19.3 | 8.4E+05 | 2.9E+05 |
| | 6 | 20.4 | 1.5E+06 | 5.6E+05 | 18.5 | 8.5E+05 | 2.8E+05 |
| | 7 | 21.3 | 1.2E+06 | 4.7E+05 | 17.6 | 9.6E+05 | 3.0E+05 |
| | 8 | 20.5 | 2.2E+06 | 8.2E+05 | 19.5 | 8.4E+05 | 3.0E+05 |
| | 9 | 23.1 | 1.3E+06 | 5.5E+05 | 21.3 | 9.2E+05 | 3.6E+05 |
| Interior of ΦD | | Ave[$\rho_{TD\Phi D}*\tan(\alpha_{\Phi D})$] 6.2E+05 | | | Ave[$\rho_{TD\Phi D}*\tan(\alpha_{\Phi D})$] 3.2E+05 | | |
| | | Δ/Ave[$\rho_{TD\Phi D}*\tan(\alpha_{\Phi D})$] 57% | | | Δ/Ave[$\rho_{TD\Phi D}*\tan(\alpha_{\Phi D})$] 51% | | |
| Processing situation | | Fragmentation | | | Excellent | | |
| Situation after epitaxy of a device | | — | | | Cracking | | |

TABLE 2.2

| | | Experimental example 13 | | | Experimental example 14 | | |
|---|---|---|---|---|---|---|---|
| | Diameter | 100 | | | 100 | | |
| Original substrate | Substrate structure | GaN template | | | GaN template | | |
| | Dislocation density | 7.0E+07 | | | 7.0E+07 | | |
| Initial growth condition | | Electrochemical corrosion + high-temperature growth | | | Electrochemical corrosion + high-temperature growth | | |
| Growth rate | | Low growth rate | | | High growth rate | | |
| Interior of Φ1 | | $\alpha_{\Phi 1}$ | $\rho_{TD\Phi 1}$ | $\rho_{TD\Phi 1}*\tan(\alpha_{\Phi 1})$ | $\alpha_{\Phi 1}$ | $\rho_{TD\Phi 1}$ | $\rho_{TD\Phi 1}*\tan(\alpha_{\Phi 1})$ |
| Positions | 1 | 20.3 | 8.3E+05 | 3.1E+05 | 29.6 | 8.8E+05 | 5.0E+05 |
| | 2 | 22.3 | 9.4E+05 | 3.9E+05 | 27.1 | 7.4E+05 | 3.8E+05 |
| | 3 | 21.5 | 8.1E+05 | 3.2E+05 | 29.5 | 8.8E+05 | 5.0E+05 |
| | 4 | 19.4 | 7.6E+05 | 2.7E+05 | 32.5 | 8.3E+05 | 5.3E+05 |
| | 5 | 19.8 | 8.8E+05 | 3.2E+05 | 30.5 | 8.7E+05 | 5.1E+05 |
| | 6 | 18.5 | 9.1E+05 | 3.0E+05 | 26.5 | 8.0E+05 | 4.0E+05 |
| | 7 | 21.5 | 7.3E+05 | 2.9E+05 | 29.5 | 9.0E+05 | 5.1E+05 |
| | 8 | 20.6 | 9.9E+05 | 3.7E+05 | 32.1 | 9.6E+05 | 6.0E+05 |
| | 9 | 20.5 | 8.0E+05 | 3.0E+05 | 28.7 | 8.4E+05 | 4.6E+05 |
| Interior of ΦD | | Ave[$\rho_{TD\Phi D}*\tan(\alpha_{\Phi D})$] 3.2E+05 | | | Ave[$\rho_{TD\Phi D}*\tan(\alpha_{\Phi D})$] 4.9E+05 | | |
| | | Δ/Ave[$\rho_{TD\Phi D}*\tan(\alpha_{\Phi D})$] 37% | | | Δ/Ave[$\rho_{TD\Phi D}*\tan(\alpha_{\Phi D})$] 46% | | |
| Processing situation | | Excellent | | | Cracking | | |
| Situation after epitaxy of a device | | Excellent | | | — | | |

In the above embodiments, cracking refers to a case where a crack appears inside the free-standing GaN substrate, but does not divide the substrate into two or more pieces. The crack may be a crack that does not penetrate upper and lower surfaces inside the free-standing GaN substrate, or a crack that penetrates the upper and lower surfaces, and is defined as a crack visible to naked eyes.

Fragments refer to a case where a crack appears in the free-standing GaN substrate, and divides the free-standing GaN substrate into at least two pieces.

Hence, in the first embodiment, the average value $\rho_{TD\Phi1}*\tan(\alpha_{\Phi1})$ of the products $Ave[\rho_{TD\Phi D}*\tan(\alpha_{\Phi D})]$ of the threading dislocation densities at the nine point positions of the free-standing GaN substrate and the tangent values of threading dislocation tilt angles is set to not greater than 1E6 cm$^{-2}$. Therefore, the macroscopic stress caused by the threading dislocations of the free-standing GaN substrate 2 is relatively small, so that fragments of the GaN substrate that occur in the process of substrate separation, shape processing, or grinding and polishing or in the process of epitaxially fabricating the related device on the substrate can be effectively suppressed. The quotient of the difference between the maximum value and the minimum value of the products of the threading dislocation densities and the tangent values of the threading dislocation tilt angles divided by the average value (the uniformity of nine product values) $\Delta/Ave[\rho_{TD\Phi D}*\tan(\alpha_{\Phi D})]$ is set to not greater than 50%. Therefore, the microscopic stress caused by the threading dislocations of the free-standing GaN substrate 2 is relatively small, so that a more uniform microscopic stress distribution can be achieved. The cracking of the GaN substrate that occurs in the process of substrate separation, shape processing, or grinding and polishing or in the process of epitaxially fabricating the related device on the substrate can be effectively suppressed. More preferably, the value of $\alpha_{\Phi1}$ in a 1 mm circle is relatively small. When $\alpha$ in the local micro-region is small, the micro-stress in the local region is small; otherwise, the stress in the local region increases with the tangent function of the $\alpha$ angle, and large local micro-stress is easy to cause local cracking of GaN. In addition, the present inventor has found in long-term research that the quotient of the difference between the maximum value and the minimum value of the products of the threading dislocation densities and the tangent values of the threading dislocation tilt angles is divided by the average value (uniformity of nine product values) is controlled within 50%, so as to effectively suppress the cracking of the GaN substrate. Otherwise, even if there is no problem in the process of substrate separation, shape processing, or grinding and polishing, in the process of epitaxially fabricating the related device on the substrate, for example, in the process of fabricating a laser epitaxial wafer, cracking of the GaN substrate still occurs.

For a person skilled in the art, the present disclosure is apparently not limited to the details of the above exemplary embodiments, and the present disclosure can be implemented in other specific forms without departing from the spirit or basic features of the present disclosure. Accordingly, anyway, the embodiments are considered to be exemplary and nonrestrictive. The scope of the present disclosure is defined by the appended claims rather than the above description, and thus all changes falling within the meaning and scope of equivalent conditions of the claims are intended to be included in the present disclosure.

In addition, it should be understood that the description is described in accordance with implementations, but not each implementation only contains one independent technical solution, such narrative manner of the description is only for the sake of clarity, and thus a person skilled in the art regards the description as a whole, and the technical solutions in various embodiments may also be appropriately combined to form other implementations that may be understood by a person skilled in the art.

What is claimed is:

1. A gallium nitride substrate, wherein the gallium nitride substrate is obtained by means of non-periodic structure epitaxial growth; the gallium nitride substrate has a surface having a diameter not less than 50 mm; nine circular regions having a diameter not greater than 1 mm are taken on a surface of the gallium nitride substrate; positions of the nine circular regions are respectively distributed at a center position and eight surrounding positions of the surface of the gallium nitride substrate; threading dislocation densities and threading dislocation tilt angles are calculated at the nine circular regions using a multi-photon excitation photoluminescence spectrum; an average value of products of the threading dislocation densities in the nine circular regions and tangent values of the threading dislocation tilt angles is not greater than 1E6 cm-2; and a quotient of a difference between a maximum value and a minimum value of the products of the threading dislocation densities in the nine circular regions and the tangent values of the threading dislocation tilt angles divided by the average value is not greater than 50%.

2. The gallium nitride substrate according to claim 1, wherein the gallium nitride substrate has a surface having a diameter not less than 100 mm, and the average value of the products of the threading dislocation densities in the nine circular regions and the tangent values of the threading dislocation tilt angles is not greater than 5E5 cm-2.

3. The gallium nitride substrate according to claim 1, wherein the gallium nitride substrate has a surface having a diameter not less than 100 mm, and the quotient of the difference between the maximum value and the minimum value of the products of the threading dislocation densities in the nine circular regions and the tangent values of the threading dislocation tilt angles divided by the average value is not greater than 40%.

4. The gallium nitride substrate according to claim 1, wherein the eight surrounding positions are located on a same circumference and are distributed along the circumference at an equal interval.

5. A semiconductor composite substrate using the gallium nitride substrate according to claim 1 as a supporting substrate.

* * * * *